United States Patent [19]
Tanaka et al.

[11] Patent Number: 6,044,128
[45] Date of Patent: Mar. 28, 2000

[54] X-RAY IMAGING APPARATUS AND X-RAY IMAGING ANALYSIS APPARATUS

[75] Inventors: Manabu Tanaka; Mitsushi Ikeda; Kouhei Suzuki, all of Kanagawa-ken, Japan

[73] Assignee: Kabushiki Kaisha Toshiba, Kawasaki, Japan

[21] Appl. No.: 09/018,660

[22] Filed: Feb. 4, 1998

[30] Foreign Application Priority Data

Feb. 4, 1997 [JP] Japan .................................. 9-021806

[51] Int. Cl.⁷ ......................................................... H05G 1/64
[52] U.S. Cl. ...................................... 378/98.8; 250/370.09
[58] Field of Search ..................... 378/98.8, 99; 359/54, 359/102; 250/370.09, 370.14

[56] References Cited

U.S. PATENT DOCUMENTS

| | | | |
|---|---|---|---|
| 4,689,487 | 8/1987 | Nishiki et al. . | |
| 4,888,246 | 12/1989 | Kuwata et al. | 428/432 |
| 5,187,602 | 2/1993 | Ikeda et al. . | |
| 5,276,329 | 1/1994 | Hughes | 250/370.11 |

*Primary Examiner*—David P. Porta
*Assistant Examiner*—Michael J. Schwartz
*Attorney, Agent, or Firm*—Oblon, Spivak, McClelland, Maier & Neustadt, P.C.

[57] ABSTRACT

An X-ray imaging apparatus utilized in an imaging analysis apparatus that includes plural charge conversion devices for converting irradiated X-rays into electric charge and corresponding plural charge storage devices for storing the converted electric charge. Each charge conversion device and charge storage device represent a pixel in an image and are read by a thin film transistor. A thin film diode is connected to each charge storage device to discharge excessive stored voltage. The thin film diode has a Metal-Insulator-Metal (MIM structure), a Metal Semi-Insulator (MSI structure), or a Back-to-Back (BTB structure).

10 Claims, 10 Drawing Sheets

X-RAY IMAGING APPARATUS AND X-RAY IMAGING ANALYSIS APPARATUS

CROSS-REFERENCE TO RELATED APPLICATION

The present application claims benefit of priority under 35 USC §119 of Japanese Patent Application 09-21806 filed Feb. 4, 1997, the entire disclosure of which is incorporated by reference herein.

BACKGROUND OF THE INVENTION

1. Field of the Invention

The present invention relates to an X-ray imaging apparatus having a plurality of pixels arranged on a detection surface, for directly converting an irradiated incident X-ray distribution to an image signal, and more particularly to an X-ray imaging apparatus having a diode, i.e., a two terminal element having a non-linear resistance characteristic, made by thin film technology. The present invention also relates to an X-ray imaging analysis apparatus provided with the X-ray imaging apparatus for any number of uses, including medical and industrial use.

2. Discussion of the Background

Conventional imaging systems, used mainly for an X-ray image analysis, typically include an X-ray imaging screen film system using a screen film made of silver salt, a computed radiography (hereinafter called CR) system using an imaging plate coated with a photostimulable phosphor, and a digital radiography (hereinafter called the DR) system using a combination of an image intensifier (I.I.) for converting x-rays into visible light and a television set to produce an X-ray image (I.I.—TV system).

On the other hand, a clinical laboratory requires an X-ray imaging apparatus having the following features: (1) a capability of recognizing whether a correct part was photographed (imaged) by displaying a photographed part immediately after photographing, (2) a capability of processing an image for quantitative analysis, (3) high efficiency without need for developing a film, and (4) a capability of storing, detecting, conveying and handling digitizing image data. Thus, recent advances in X-ray imaging produce digital images for further processing.

In order to digitize a silver salt screen film photographed by a conventional X-ray imaging analysis, scanners have to be operated after developing a photographed film. However, this is an inefficient use of resources.

The CR system uses an imaging plate coated with a photostimulable phosphor instead of a silver salt film as an X-ray detector. The imaging plate has a very wide dynamic range as compared with the silver salt screen film and can make an image with a wide range of X-ray doses.

Upon irradiation of an X-ray on the imaging plate, an electron energy level of a luminescent center included in the photostimulable phosphor such as Eu is heightened by the X-ray energy to such an extent that an X-ray intensity distribution is stored as a latent image. Then, the luminescent center is excited by scanning the imaging plate with infrared radiation or a red laser light (wavelength $\lambda_1$), and a resultant energy is output as light having a wavelength $\lambda_2$, where $\lambda_2 < \lambda_1$ while the luminescent center heightened by the X-ray energy returns to a reference level. An electric signal in proportion to the X-ray intensity distribution can be obtained by collecting the light having the wavelength $\lambda_2$ and amplifying the collected light in a photomultiplier tube.

The CR system using a conventional imaging plate, however, is noisy and low in resolution. Also, it is easily damaged, the performance thereof deteriorates with use, and it is expensive.

In the DR system using a combination of an image intensifier and a television set, an area of the X-ray input surface of the image intensifier defines the size that can be imaged and is equivalent to a maximum field of view of about 16 inches. At an X-ray input section of the image intensifier, light from phosphor irradiated by X-rays is focused at a photoelectric surface. A photoelectron irradiated from the photoelectric surface is accelerated in an electric field of the image intensifier and then output to a phosphor screen which is illuminated. Thus, an image having variable density at the X-ray input section can be amplified and displayed at an output screen. This output image is picked up by a television camera through an optical system producing an electric image.

In the case of imaging an area of lungs, however, an imaging area 40 cm×40 cm is necessary. Further, a very fine image intensifier having a large diameter, high precision optical apparatus, and a high resolution TV camera are also necessary, increasing the volume of the entire apparatus.

To resolve some of the problems described above, another X-ray imaging apparatus is constructed of a two-dimensional array (hereinafter called the X-ray plane detector), formed by amorphous-silicon (hereinafter called the a-Si) thin film transistors (hereinafter called TFTs), and photoelectric transfer elements which are made via a production method of a liquid crystal panel as recommended in U.S. Pat. No. 4,689,487. FIG. 11 illustrates the structure of an X-ray imaging analysis apparatus having the X-ray plane detector and FIG. 12 illustrates the structure of the X-ray plane detector, respectively.

In FIG. 11, an X-ray analysis apparatus 901 is shown that includes an X-ray tube 103 supplied from a high voltage generating circuit (not shown) that confronts a detected object P, an X-ray plane detector 107 also confronting the detected object P, the X-ray tube 103 and the X-ray plane detector 107 sandwiching the detected object P, an analog-digital converter 113 for converting analog image signal output from the X-ray plane detector 107 to a digital image signal, an image processor 115, an image recording device 117 such as an optical disc, a digital-analog (D/A) converter 119, and an image monitor device 121.

The X-ray plane detector 107 includes a fluorescent board 105a for converting X-rays transmitted through the detected object P to an optical image and a plane detector 105b located adjacent to the fluorescent board 105a.

An operation of the conventional system will now be explained. As shown in FIG. 11, the detected object P is located adjacent to the fluorescent board 105a through a proper light shield member (not shown). X-rays transmitted from the X-ray tube 103 irradiate the object P and X-rays transmitted through the object form a transmitted X-ray image of the detected object P, which is converted to an optical image by the fluorescent board 105a. The optical image is converted to an image signal by the plane detector 105b on which photoelectric transfer elements are arranged in a two-dimensional array.

An analog image signal output from the X-ray plane detector 107 is converted to a digital image signal by the A/D converter 113 and input to the image processor 115. The image processor 115 processes the digital image signal by various methods and stores necessary image data in the image recording device 117. The digital image signal output from the image processor 115 is converted to an analog image signal by the D/A converter 119 and displayed on a screen of the image monitor device 121.

The X-ray plane detector 107 is a photoelectric transfer type and as shown in FIG. 12 includes picture elements e(h, k) (1≦h≦2000, 1≦k≦2000) which are arranged in a two dimensional array (hereinafter called a TFT array) and in a square shape, for example, and 2,000 pixels are arranged along one edge of the square, a select circuit for selecting a pixel along vertical and horizontal directions, and an amplifier.

Each pixel e(h, k) is formed in a photoelectric transfer film 140 that includes a PN junction formed by an a-Si Thin-Film Transistor (TFT) 144 and a-Si photo diode 148 and a pixel capacitor 142 (hereinafter called a Cst). A common bias voltage of minus several volts, for example, is applied to a P-side terminal of each photoelectric transfer film 140 by an electric source 148.

The a-Si TFT 144 included in each pixel e(h, k) has a source terminal connected to an N-side terminal of an a-Si photodiode 148, a drain terminal connected to a signal line S(h), and a gate terminal connected to a scanning line G(k).

The scanning line G(k) is alternatively controlled ON-OFF by a horizontal scanning shift register 152. The other terminal of the signal line S(h) is connected to an input of an amplifier 154 for detecting a signal through a vertical switching switch 146. The vertical switching switch 146 is provided corresponding to the signal line S(h) and alternatively controlled ON-OFF by the vertical scanning shift register 150. A signal of the selected signal line is connected to an input of the amplifier 154. The image signal is obtained from the output of the amplifier 154.

An operation of the X-ray plane detector 107 will next be explained. After X-ray exposure, light is irradiated from the fluorescent board 105a to the plane detector 105b. Light striking the plane detector causes optical current flow in the photoelectric transfer film of each pixel e(h,k), and electric charge is stored in each respective Cst in proportion to an intensity of the irradiated light.

Then, the scanning lines for alternatively selecting a pixel line are driven by a scanning line driving circuit 152. When the all TFTs connected to one scanning line G(k) are switched on, the electric charge stored in the each Cst is transferred to the switching switch 146 through the signal line S(h).

The switch 146 inputs the electric charge corresponding to each sequentially selected pixel to the amplifier 154 to convert the electric charge to a point sequential signal capable of display on a CRT. The amount of electric charge corresponds to the irradiated light intensity and the output amplitude of the amplifier is changed accordingly.

In the system as shown in FIG. 12, a digital image can be obtained directly by A/D converting the output signal of the amplifier 154. A pixel area as shown in FIG. 12 has structure similar to a TFT-LCD utilized in a notebook type personal computer and can be easily produced as a thin and large scale model.

The above explanation relates to an indirect conversion type X-ray plane detector in which irradiated X-rays are converted to visible radiation with phosphors or the like and the visible radiation is converted to electric charge with a photoelectric transfer film corresponding to each pixel.

In addition, there is a direct conversion type X-ray plane detector for directly converting irradiated X-rays to electric charge. In the direct conversion type X-ray plane detector, material and film-thickness of X-ray electric converting film have to be changed as compared with the indirect conversion type. An amount of bias voltage applied to the X-ray (optical) electric converting film and the applied method thereof have to be changed as well.

In the indirect conversion type, a potential of minus several volts is applied to a photoelectric transfer film being in part a capacitance Cse and having a 1~2 μm thickness. When radiation irradiates the photoelectric transfer film, an electric charge generated in the photoelectric transfer film is divided by voltage division and partially stored in the juxtaposed pixel capacitance Cst. In this case, the voltage applied to Cst is several volts at most, similar to a bias voltage applied to the photoelectric transfer film. In this case, the voltage applied to the Cst is several volts at maximum, similar to a bias voltage applied to the photoelectric transfer film.

On the other hand, in the direct conversion type, an X-ray electric charge converting film having a thickness of 500 μm~1 mm and a Cst are connected in series and several kV is applied. When X-rays are irradiated to pixels of the X-ray electric charge converting film, an electric charge produced in the X-ray electric converting film is stored in the Cst.

However, when excessive X-rays are irradiated to pixels of the X-ray electric charge converting film, image quality is lowered because electric current leakage of a TFT reading switch is increased, or because charge leaks into an adjacent pixel in the X-ray electric charge converting film. Also, excessive X-rays can cause the TFT reading switch and insulating layer of the Cst to be broken. Therefore, in the direct conversion type, it is necessary to avoid applying high voltage to the Cst.

In an over-voltage protection technique of the conventional direct conversion type X-ray plane detector, the prior art (Denny L. Lee et al., SPIE, vol. 2432, pp 237, 1995) shows a dielectric layer insulator formed on a x-ray electric charge converting film as shown in FIGS. 13 and 14. Three condensers, a condenser in the dielectric layer (Cd), a condenser in the X-ray electric charge converting layer (Cse), and a condenser in a pixel electrode (Cst) are connected in series and the produced electric charge is divided and stored in the X-ray electric charge transfer film so that the TFT and Cst insulator can be protected from breakage and the image can be protected from lowered quality.

In the conventional over-voltage protection technique taught by Denny Lee et al., however, the structure described needs more time to reset Cd after picking up the image than a minimum amount of time required to capture a moving image in real time. Therefore, if a detected object is moving, the transmitted x-ray image can not be seen in real time.

On the other hand, Japanese Patent Application No. 8-161977 shows a TFT actuated as a clip diode (hereinafter referred to as a protection diode) with respect to each pixel. This prior art reference does not teach provision of capacitors connected in series, unlike Denny et al., so that a reset time is sufficiently short and an X-ray transmitted image of a moving detected object can be seen in real time. However, the TFT is used as a protection diode. If one TFT is used, a ratio of the area occupied by the protection TFT to the pixel area is relatively large. Further, if leakage current is controlled, a plurality of TFTs is necessary in some cases. As the result, the number of TFTs per pixel is increased, an area ratio of pixel electrode (the effective sensor area) per pixel area (hereinafter called an opening ratio) is not easily made to be common for each pixel and the requisite pixel capacity Cst is not obtained easily.

Further, if a PN junction diode is used as a protection diode, a number of production steps is increased, and a yield of the diodes becomes lower. Therefore, production cost would be remarkably increased, since the production steps of the protection diode are different from those of the conventional a-Si TFT array. In addition, the PN junction diode made of a-Si has a poor rectification characteristic and substantial leakage current.

SUMMARY OF THE INVENTION

Accordingly, it is an object of this invention to provide an X-ray image apparatus having a high opening ratio of each X-ray detection picture element, high X-ray sensitivity and a short period reset capable of capturing X-ray transmitted images of a moving object in real time.

It is another object of the present invention is to provide an X-ray image element of which a number of production steps and a production cost is reduced.

These and other objects are accomplished by a direct conversion X-ray image apparatus that includes a thin film protection diode (TFD), i.e., a two terminal element having non-linear resistance characteristic and which discharges pixel charge when a pixel voltage exceeds a predetermined voltage, for example, having a metal-insulator-metal (MIM) structure, a metal semi-insulator (MSI) structure of a back-to-back (BTB) structure. Thus, the TFD can provide a high opening ratio and a Cst of large capacitance even though the TFD is of smaller size than a protection circuit of a conventional TFT type. Therefore, the TFD can provide the X-ray imaging apparatus with high detection sensitivity and a high S/N ratio.

The X-ray image device using the TFD according to the present invention can reduce a number of production steps as compared with a conventional a-Si TFT array, thereby controlling production costs and production yield as economically and efficiently as possible.

One TFD used for an X-ray image apparatus according to the present invention has a non-linear resistance characteristic without polarity difference. As an example, the resistant characteristic of a TFD having MIM structure is shown in the following equation (1).

$$I = \chi V \exp(\beta V) \quad (1)$$
$$I/V = 1/R = \chi \exp(\beta V)$$

where, I is current, $\chi$ is a constant of dielectric ratio, V is voltage, $\beta$ is a nonlinear characteristic parameter, and R is an amount of resistance.

Equation (1) is a so-called Pool-Frenkel equation. High voltage induced in an insulator layer by voltage applied between both electrodes of the MIM structure can reduce a depth of donor in a solid bulk (Coulomb potential barrier) and increase electric conductivity in order to discharge electrons easily (usually called the Pool-Frenkels effect).

The MIM structure is operated as a switching element having nonlinear electric resistant characteristic, as described above, by providing a metal oxide layer. Also, other TFD structures, for example, MSI (metal semi-insulator), and BTB (back-to-back) structures have characteristics similar to the MIM switching element and may be substituted therefore.

BRIEF DESCRIPTION OF THE DRAWINGS

A more complete appreciation of the invention and many of its attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
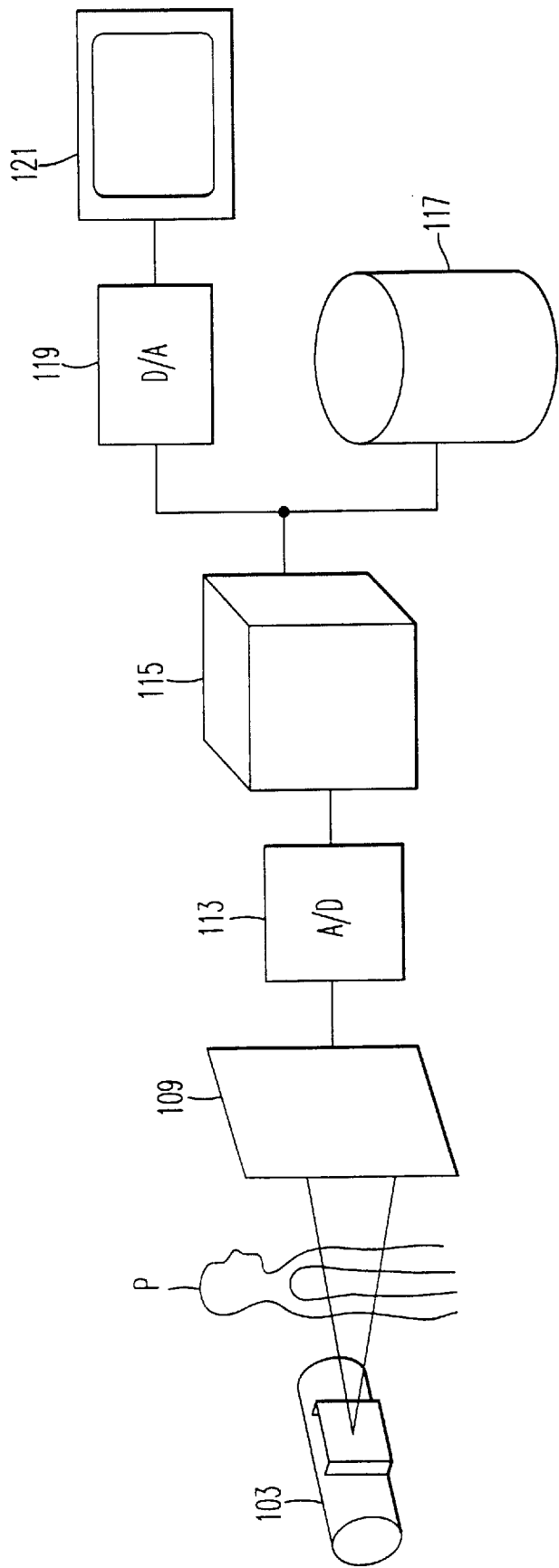
FIG. 1 is a block diagram of an X-ray image analysis apparatus with an X-ray imaging apparatus according to the present invention.

Referring now to the drawings, wherein like reference numerals designate identical or corresponding parts throughout the several views, and more particularly to FIG. 1 thereof, there is illustrated a structure of an X-ray imaging analysis apparatus with a direct conversion type X-ray imaging apparatus according to the present invention.

As shown in FIG. 1, the X-ray imaging analysis apparatus 101 includes an X-ray tube 103 supplied high voltage from a high voltage generator (not shown) and confronting a detected object P, an X-ray imaging apparatus 109, with the X-ray tube 103 and the X-ray imaging apparatus 109 sandwiching the detected object P, an A/D converter 113 for converting an analog image signal output from the X-ray imaging apparatus 109 to a digital image signal, an image processor 115, an image recording device 117 such as an optical disc, a D/A converter 119, and an image monitor 121.

Operation of the X-ray imaging analysis apparatus will be explained. As shown in FIG. 1, the detected object P is positioned adjacent the X-ray imaging apparatus 109. An X-ray image obtained by transmitting X-rays from the X-ray tube 103 through the object P is directly converted to an image signal by the X-ray imaging apparatus 109 including X-ray electric charge transfer elements arranged in a two dimensional array.

An analog signal output from the X-ray imaging apparatus 109 is converted to a digital image signal by the A/D converter 113 and input to the image processor 115. The image processor 115 processes the input image by various methods and records necessary images in the image recording device 117. A digital image signal output from the image processor 115 is converted to an analog image signal by the D/A converter 119 and displayed on a screen of the image monitor device 121.

An X-ray image apparatus comprised in the above described X-ray image analysis apparatus 101 may have the following embodiments and modified embodiments.

Figure 2A:
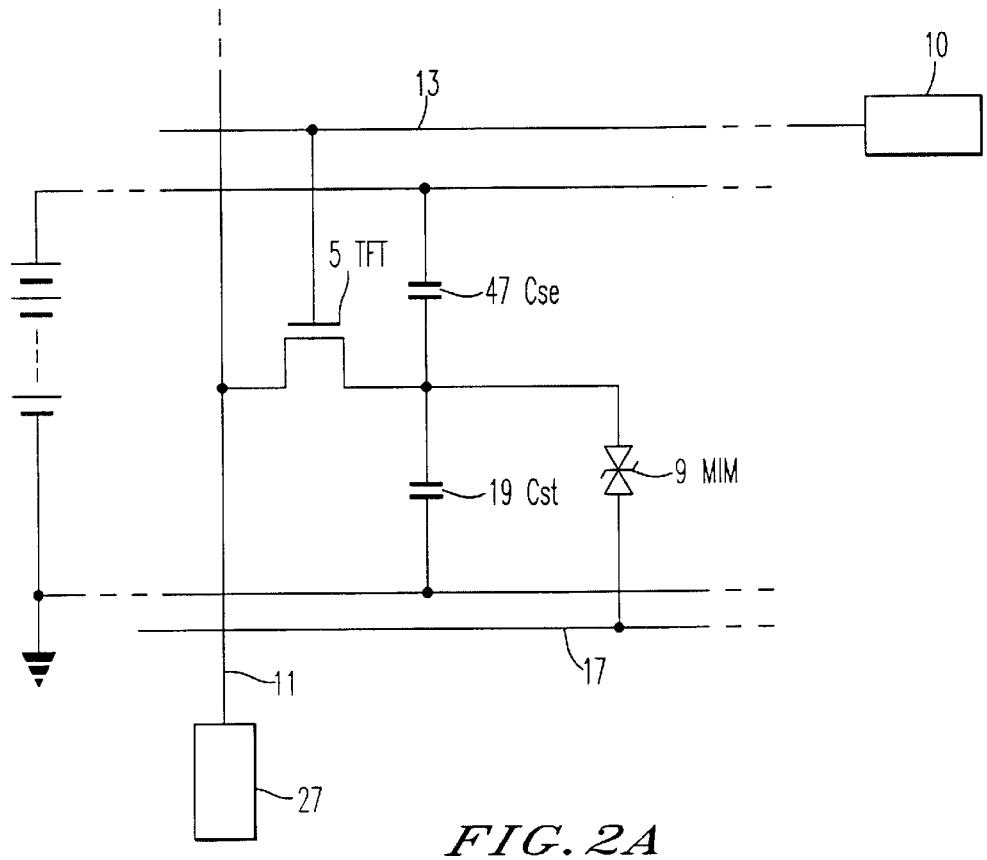
FIG. 2 is a plan view of first embodiment of the X-ray imaging apparatus according to the present invention.
Figure 2B:
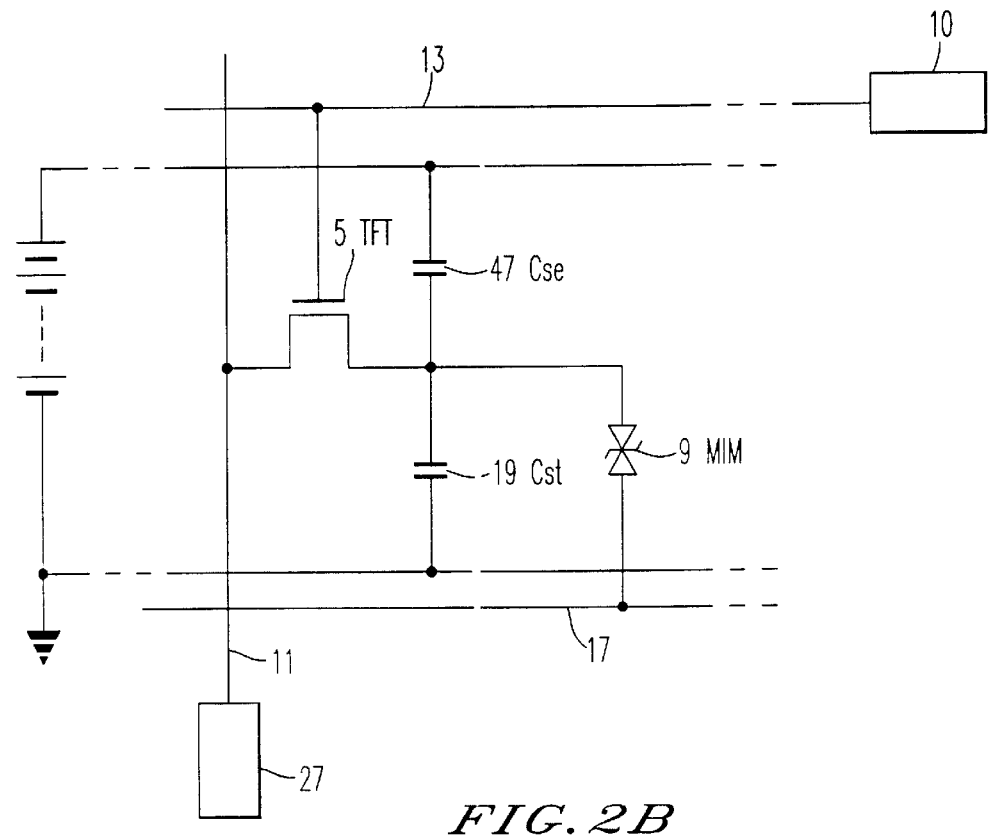
Figure 3:
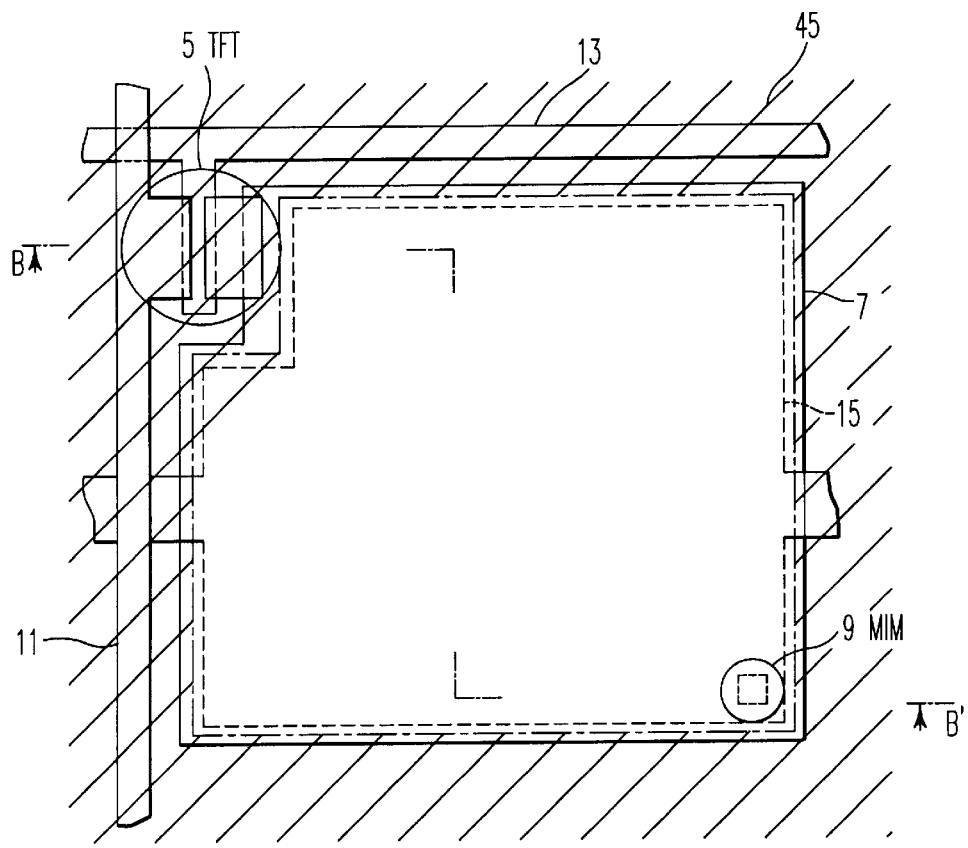
FIG. 3 is a cross-sectional view along line A–A' in FIG. 2.

FIG. 2 shows an enlarged plan view of one pixel out of 2000×2000 pixels of a first embodiment of an X-ray imaging apparatus according to the present invention. FIG. 3 shows a cross-sectional view taken along line A–A' in FIG. 2.

As shown in FIG. 2 and FIG. 3, each pixel of the X-ray imaging apparatus includes a TFT 5, a pixel electrode 7, a TFD with a MIM structure (hereinafter called the MIM) 9, a signal read line (hereinafter called the signal line) 11, a gate line 13, a supplement electrode 15, and a bias line 17 for the MIM. Each of the above components are constructed on a glass substrate 3.

In FIG. 2 and FIG. 3, however, components such as an X-ray electric charge transfer film, a bias electrode for the X-ray electric charge transfer film and a shift register, a multiplexer, and a preamplifier located outside of the pixel and operated for scanning pixels are omitted for clarity.

As shown in FIG. 2, a gate 21 and a drain 25 of the TFT 5 are connected to the gate line 13 for picture elements arranged along a horizontal line and the signal line 11 for pixels arranged along a vertical line, respectively.

The Cst 19 located between the pixel electrode 7 and the supplement electrode 15 is a capacitor for storing electric charge produced by X-rays irradiated to the X-ray electric charge transfer film 47 located between the pixel electrode 7 and a common electrode 49.

The MIM structure 9 is connected to an intermediate portion between the picture element electrode 7 and the bias line 17 for the MIM structure and prevents lowered image quality caused by electric current leakage of the TFT 5 or a charge leaking into adjacent pixels of the X-ray electric charge converting layer. Also, MIM structure 9 prevents the TFT and the insulator layer of the Cst from being broken by excessive voltage.

If voltage caused by electric charge stored in the Cst 19, that is, the voltage applied to the MIM structure 9 becomes a predetermined voltage at which an insulator of the TFT 5 is not broken, image quality is not lowered, and charge on Cst is discharged via MIM structure 9 as a protective diode. Therefore, with the MIM structure 9 acting as a protective diode, excessive electric charge is discharged to the exterior of the pixel. At the time of discharge, the bias line 17 for the MIM structure 9 is actuated as a line for discharging electric charge. The predetermined level at which electric charge begins to discharge from the MIM 9 can be changed by setting a potential of the bias line 17 of the MIM.

The electric charge stored in each pixel is switched by the respective TFT 5 connected to the gate line 13. By scanning the gate line 13, the stored charge is output to the signal line 11. The output electric charge is transmitted to an amplifier (not shown).

As shown in FIG. 2 and in the cross-sectional view in FIG. 3, the first embodiment according to the present invention includes a first metallization patterned into a gate 21 provided on a glass substrate 3 and forming a gate of the TFT 5, the gate line 13, a leading pad portion 10, a supplemental electrode 15, a MIM electrode 29 and a bias line 17 for the MIM. An oxide film 33 is produced by an anodic oxidation is provided on at least a surface of the MIM electrode 29. On the oxide film 33, a $SiO_2$ layer 35 is formed. However, the $SiO_2$ layer 35 is removed from the portions corresponding to the leading pad portion 10, a contact point of a bias line 17 and the MIM 9.

The pixel electrode 15, formed of the same metallization layer which forms the gate 21, for the Cst 19 is provided at pixel portions where the TFT 5 and the MIM 9 are removed. Regarding the TFT 5, an a-Si layer 39, a SiNx layer 41 serving as an etch stopper, and a n+ a-Si layer 43 are laminated on the $SiO_2$ layer 35. A source 23 and the drain 25 operated as electrodes are made of a second metallization and provided on the laminated layers. The second metallization is also utilized as the signal line 11, the leading pad portion 27, the voltage supply line 37, and the MIM electrode 31. The pixel electrode 7 may be formed simultaneously.

In such a case, an electrode 23 at the pixel electrode (source) side of the TFT 5, an upper MIM electrode 31, and the pixel electrode 7 may be integrally formed. Thereon, a protective film 45 surrounding the pixel electrode 7, an X-ray electric charge transfer film 47 and a common electrode 49 made of a further metallization are laminated in that order. With the above described structure, a direct conversion type X-ray imaging apparatus is formed.

Figure 4:
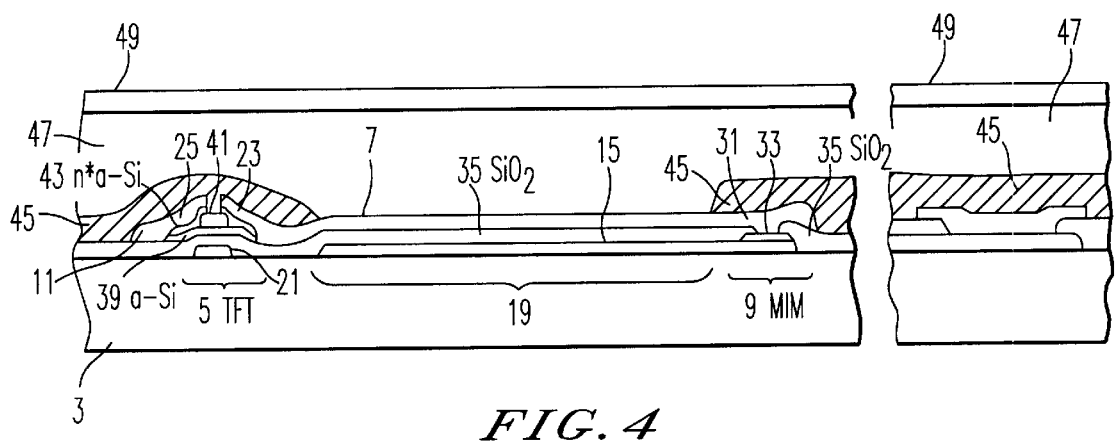
FIG. 4(a) is a circuit diagram of the first embodiment of the X-ray imaging apparatus according to the present invention.
FIG. 4(b) is a circuit diagram of a modified first embodiment of the X-ray imaging apparatus according to the present invention.
Figure 5:
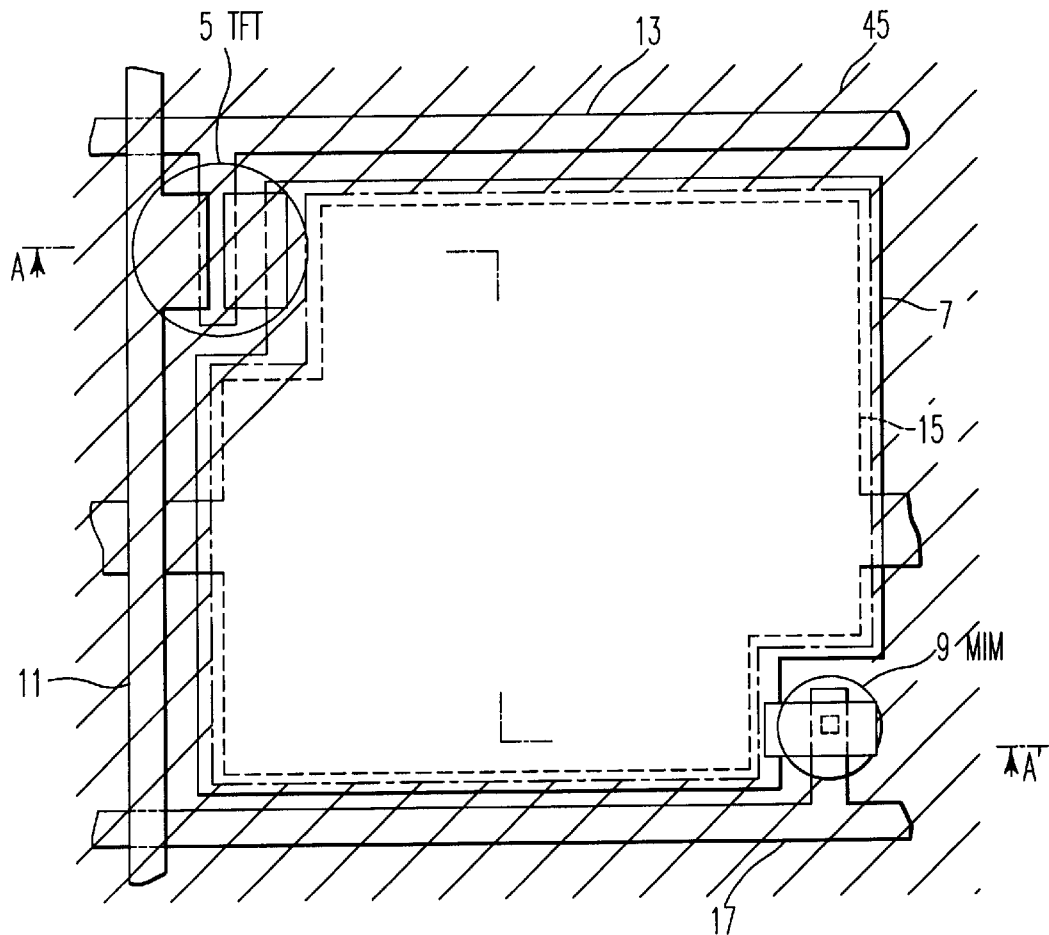
FIG. 5 is a plan view of a modified embodiment of the first embodiment of the X-ray imaging apparatus according to the present invention.
Figure 6:
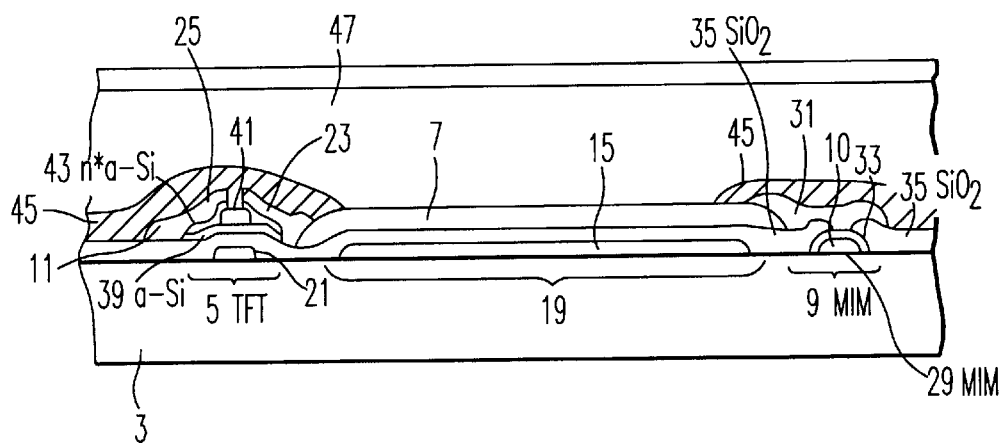
FIG. 6 is a cross-sectional view along line B–B' in FIG. 5.

In the first embodiment of FIG. 3, a circuit representation of which is shown in FIG. 4(a), a lower MIM electrode 29 and the bias line 17 are separately formed. However, a part of the supplemental electrode 15 may be used as the lower MIM electrode 29 in common and a potential of the supplemental electrode 15 and the lower MIM electrode 29 may be set in common. In such a case, an area of the pixel electrode 7 can be enlarged by removing an area for the bias line 17. The pixel electrode 7 may be formed integrally with the signal line 11, the leading pad portion 27, the voltage supply line 37 and the upper MIM electrode 31. FIG. 4(b) shows a modified embodiment of the first embodiment in which the bias line is omitted. FIG. 5 and FIG. 6 shows a plan view and a cross-sectional view taken a line B–B' in FIG. 5 of the modified embodiment, respectively.

In the first embodiment and the modified embodiment thereof, the metallization forming the gate 21 and electrode 15 may include Ti, Cr, Ta, Mo, MoW, MoTa, Al, indium tin oxide (hereinafter called the ITO) or a laminate structure selected therefrom.

The metallization forming elements 25, 23, 31 and 7 may include Ti, Cr, Ta, Mo, MoW, MoTa, Al, ITO or a laminate structure selected therefrom.

The metallization used as the common electrode 49 may include Ti, Cr, Ta, Mo, MoW, MoTa, Al, ITO or a laminate structure selected therefrom. As the protective film, SiNx, $SiO_2$ and polyimide may be utilized. As the X-ray electric charge transfer film 47, a-Semiconductor may be utilized.

As the TFT 5, an etch stopper in a contrary stagger type is used, but a contrary channel cut type in the contrary stagger type or a normal stagger type may be used. Although a-Si is used as a silicon layer to form the TFT 5, polysilicon may be used.

In the direct conversion type X-ray imaging apparatus which is one X-ray imaging apparatus of the X-ray imaging analysis apparatus, the TFD having the MIM structure is used as a protection diode for preventing the TFT 5 from breaking and image quality from being lowered. Thereby, the area of the TFT is relatively small with respect to a pixel and production steps of the TFT array need not change much.

Figure 7:
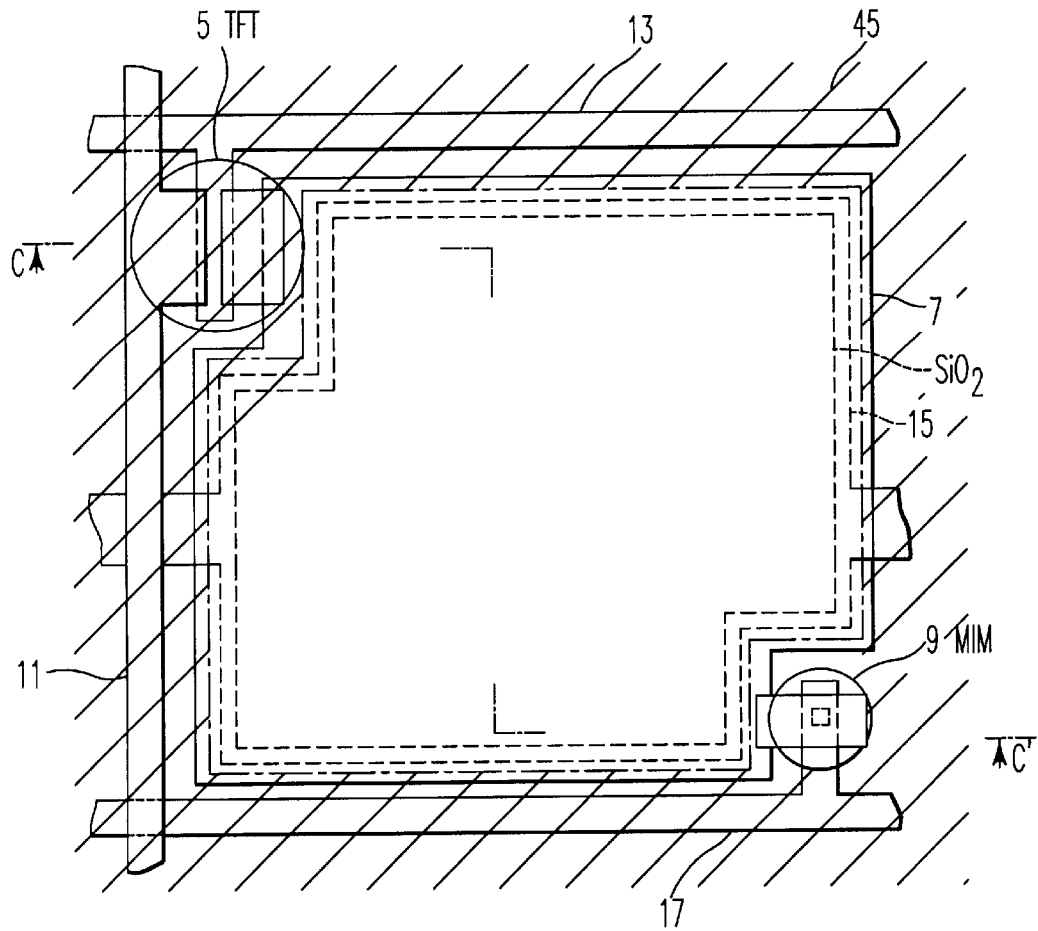
FIG. 7 is a plan view of a second embodiment of the X-ray imaging apparatus according to the present invention.
Figure 8:
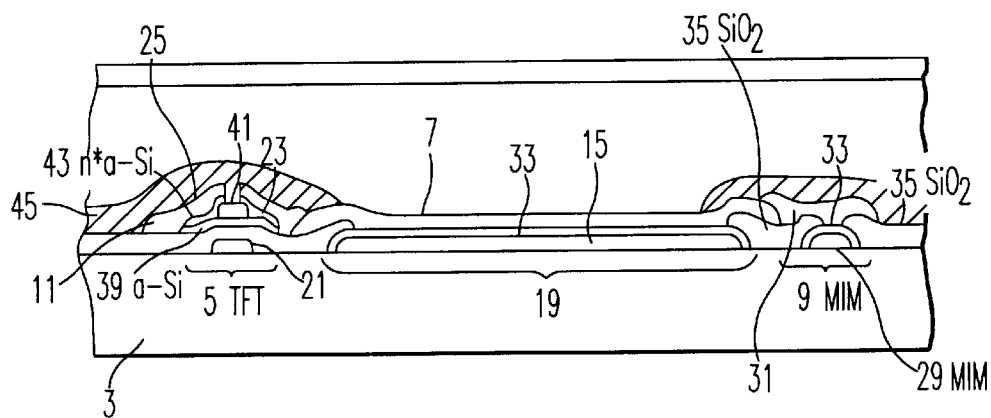
FIG. 8 is a cross-sectional view along line C–C' in FIG. 7.

A second embodiment according to the present invention will be explained. FIG. 7 shows a plan view of the second embodiment of an x-ray imaging apparatus according to the present invention, illustrating, for example, one enlarged pixel of an X-ray imaging apparatus formed by 2000×2000 pixels. FIG. 8 is a cross-sectional view taken along line C–C' in FIG. 7.

Functioning of the second embodiment as shown in the FIGS. 7 and 8 is similar to that of the first embodiment. However, an oxide film 33 formed of the metallization serving as Cst electrode 15 is used as an insulator of the Cst 19 instead of the SiO$_2$ layer 35. For example, when Ta is used for the metallization 15, the dielectric ratio of the Ta oxide film 33 is seven times higher than that of the SiO$_2$ layer 35 so that the pixel capacitance Cst can be increased. Thus, even if a size of the pixel is decreased, the charge capacity of Cst remains sufficient.

The second embodiment will be explained with reference to the plan view of FIG. 7 and the cross-sectional view of FIG. 8.

On the glass substrate 3, a first segmented metallization includes a TFT gate 21, a gate line 13, a leading pad portion 10, a supplement electrode 15, a lower MIM electrode 29 and a bias line 17 for the MIM 9. An oxide film 33 of the first metallization, produced by anodic oxidation, is provided on at least the lower MIM electrode 29 and the supplemental electrode 15. The SiO$_2$ layer 35 is formed thereon. However, the SiO$_2$ layer 35 is not formed at portions corresponding to the leading pad portion 27, a contact point of a voltage supply line (not shown in FIG. 8), the MIM 9 and the supplemental electrode 15.

As an insulator of Cst 19, the oxide film 33 is used. The pixel electrode 7 for the Cst 19 is formed at a portion in the pixel where the TFT 5 and the MIM 9 are removed. Regarding the TFT 5, a-Si layer 39, etch stopper SiNx layer 41 and n+ a-Si layer 43 are laminated on the SiO$_2$ layer. On the laminated layers, a source electrode 23 and a drain electrode 25 are made of a second metallization different than the first metallization. The second metallization also may form a signal line 11, a leading pad portion 27, a voltage supply line (not shown in FIG. 8) and the upper MIM electrode 31.

A second metallization may form the pixel electrode 7. However, in such a case, the source 23 of the TFT 5, the upper MIM electrode 31 and the pixel electrode 7 may be formed integrally. Thereon, a protection layer 45, a X-ray electric charge transfer film 47 and a third metallization used as the common electrode 49 are formed. With the above structure, an X-ray imaging apparatus of an X-ray imaging analysis apparatus is formed.

The first metallization may include Ti, Cr, Ta, Mo, MoW, MoTa, Al, ITO or a laminate structure selected therefrom. The second metallization may include Ti, Cr, Ta, Mo, MoW, MoTa, Al, ITO or a laminate structure selected therefrom. The third metallization used as the common electrode 49 may include Ti, Cr, Ta, Mo, MoW, MoTa, Al, ITO or a laminate structure selected therefrom. As the protective film, SiNx, SiO$_2$ and polyimide may be utilized. As the X-ray electric charge transfer film 47, a-Semiconductor may be utilized.

As the TFT 5, an etching stopper type in a contrary stagger type is used, but a contrary channel cut type in the contrary stagger type or a normal stagger type may be used. Although a –Si is used as the silicon layer of the TFT 5, poly-silicon may also be used.

In the direct conversion type X-ray imaging apparatus which is one X-ray imaging apparatus of the X-ray imaging analysis apparatus, the TFD having the MIM structure is used as a protection diode for preventing the TFT 5 from being broken and image quality from being lowered. Thereby, the area of the TFT is relatively small with respect to a pixel and production steps of the TFT array need not change much. Since the pixel capacitor includes an insulator formed as an oxide film of the metal capacitor electrode, a Cst having high dynamic range, such as used for photographing, is obtained. Even if a pixel is reduced in size, a sufficient capacitive value can be maintained.

Figure 9:
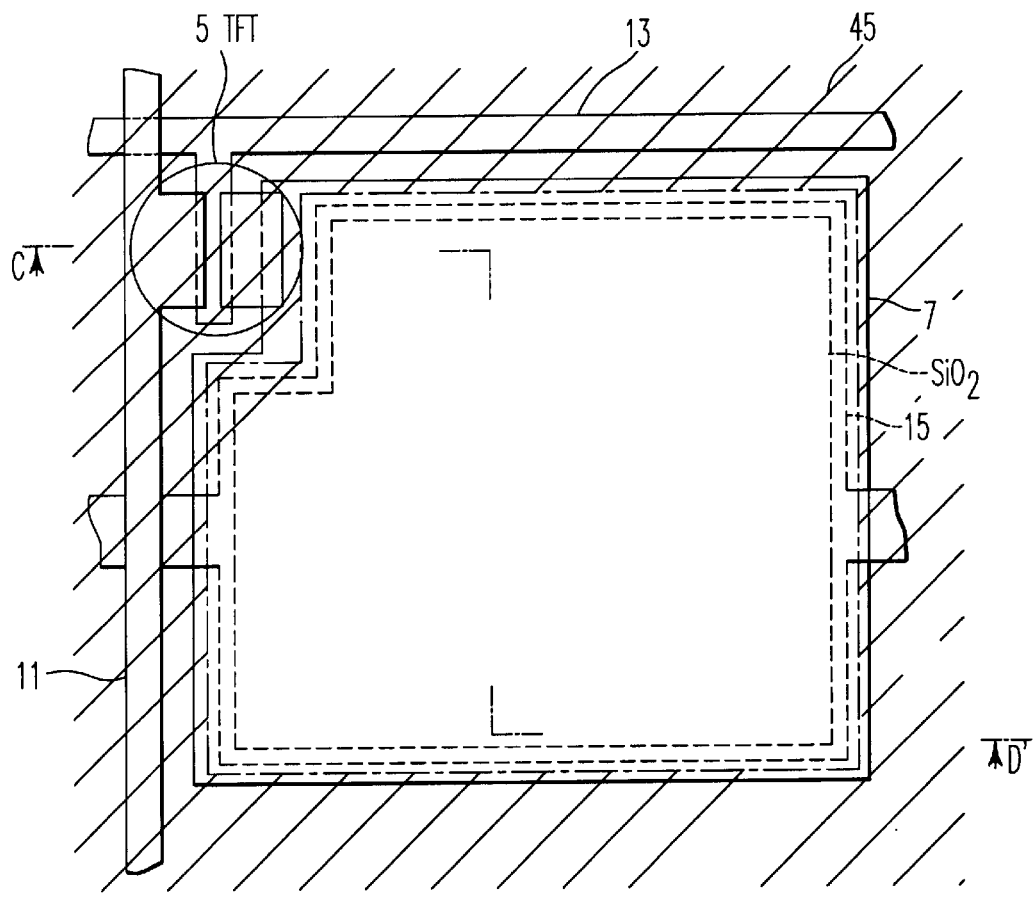
FIG. 9 is a plan view of a third embodiment of the X-ray imaging apparatus according to the present invention.
Figure 10:
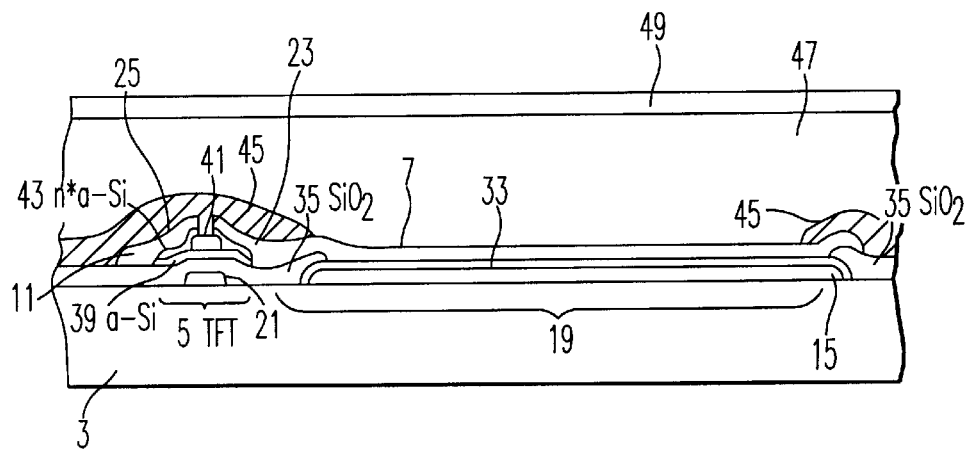
FIG. 10 is a cross-sectional view taken along line D–D' in FIG. 9.
Figure 11:
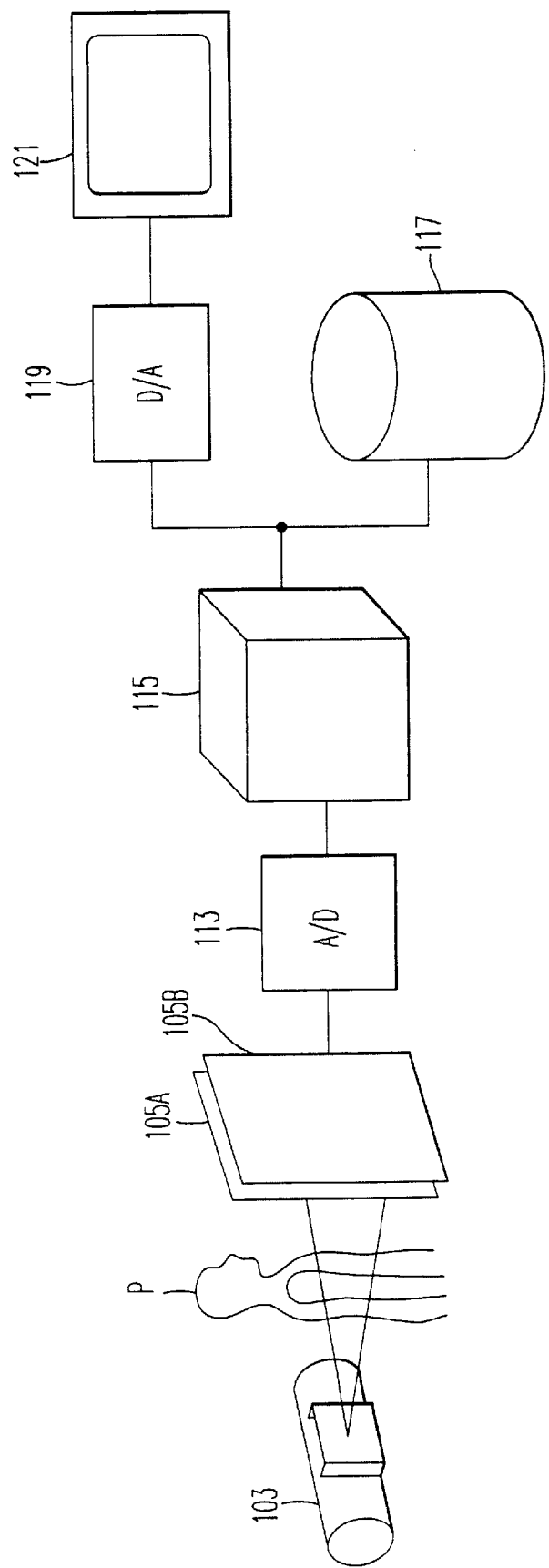
FIG. 11 is a block diagram of an X-ray imaging apparatus with a conventional X-ray plane detector.
Figure 12:
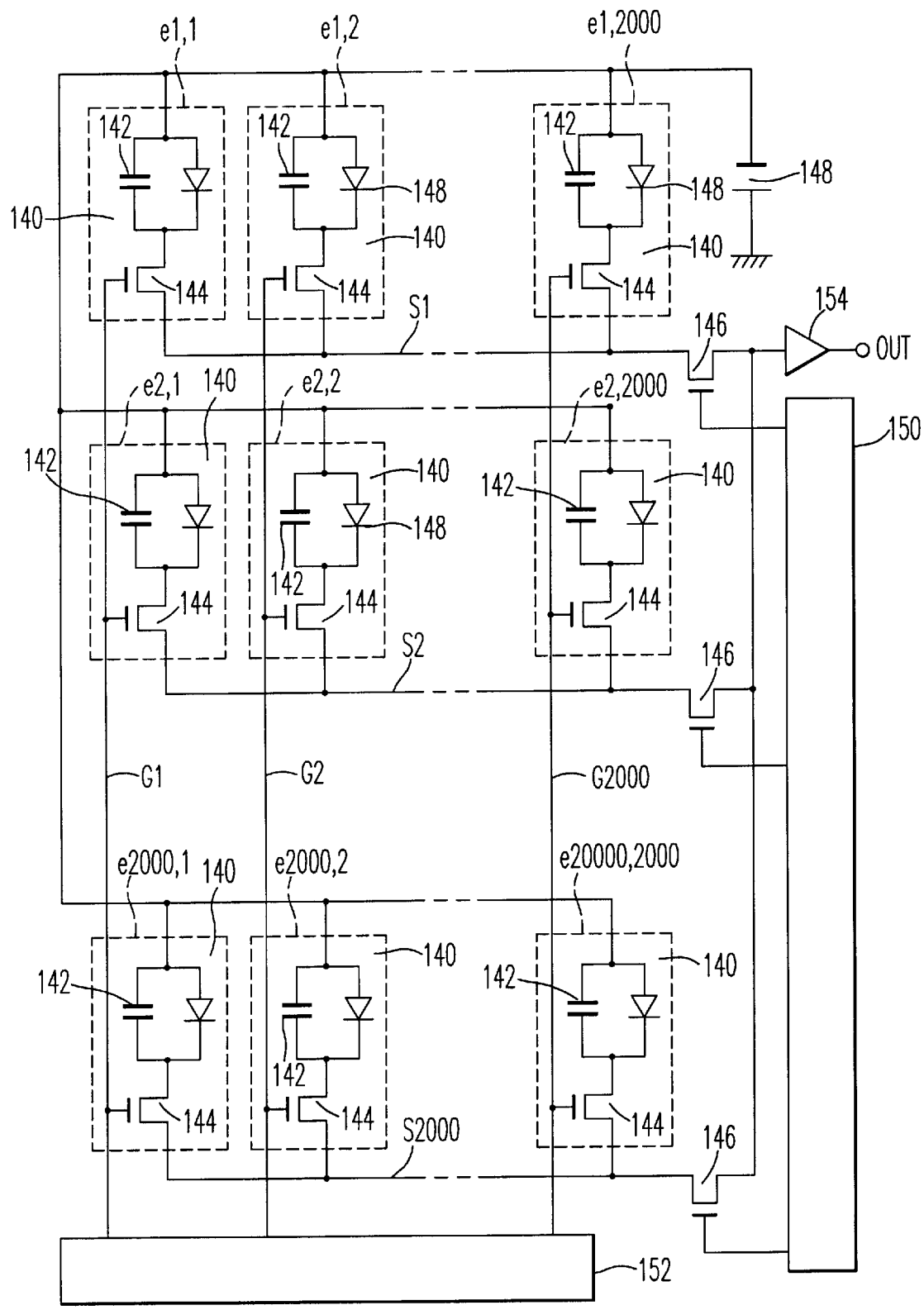
FIG. 12 is a circuit diagram of a conventional X-ray imaging apparatus with amorphous-silicon thin film transistors.
Figure 13:
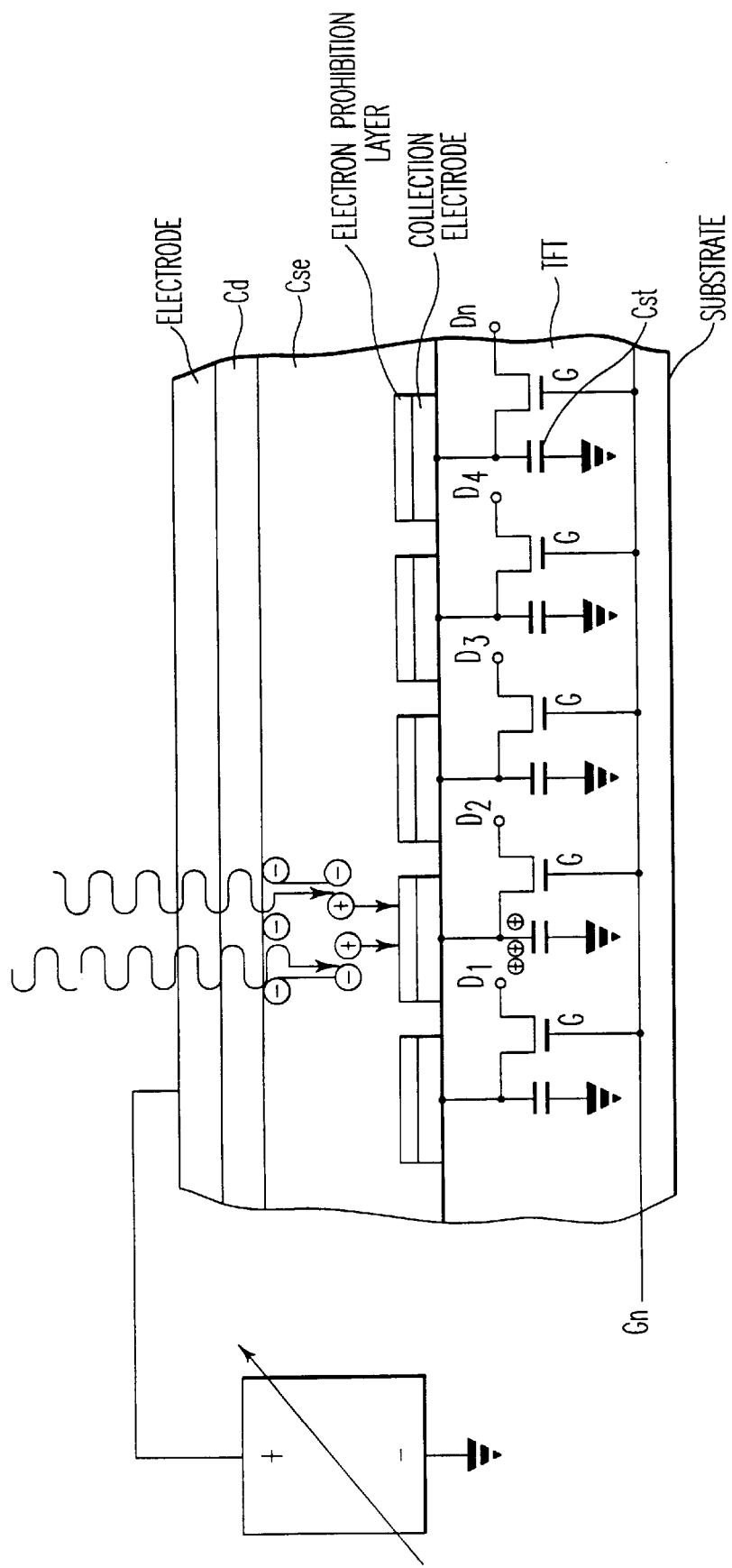
FIG. 13 is a cross-sectional view of the conventional X-ray imaging apparatus.
Figure 14:
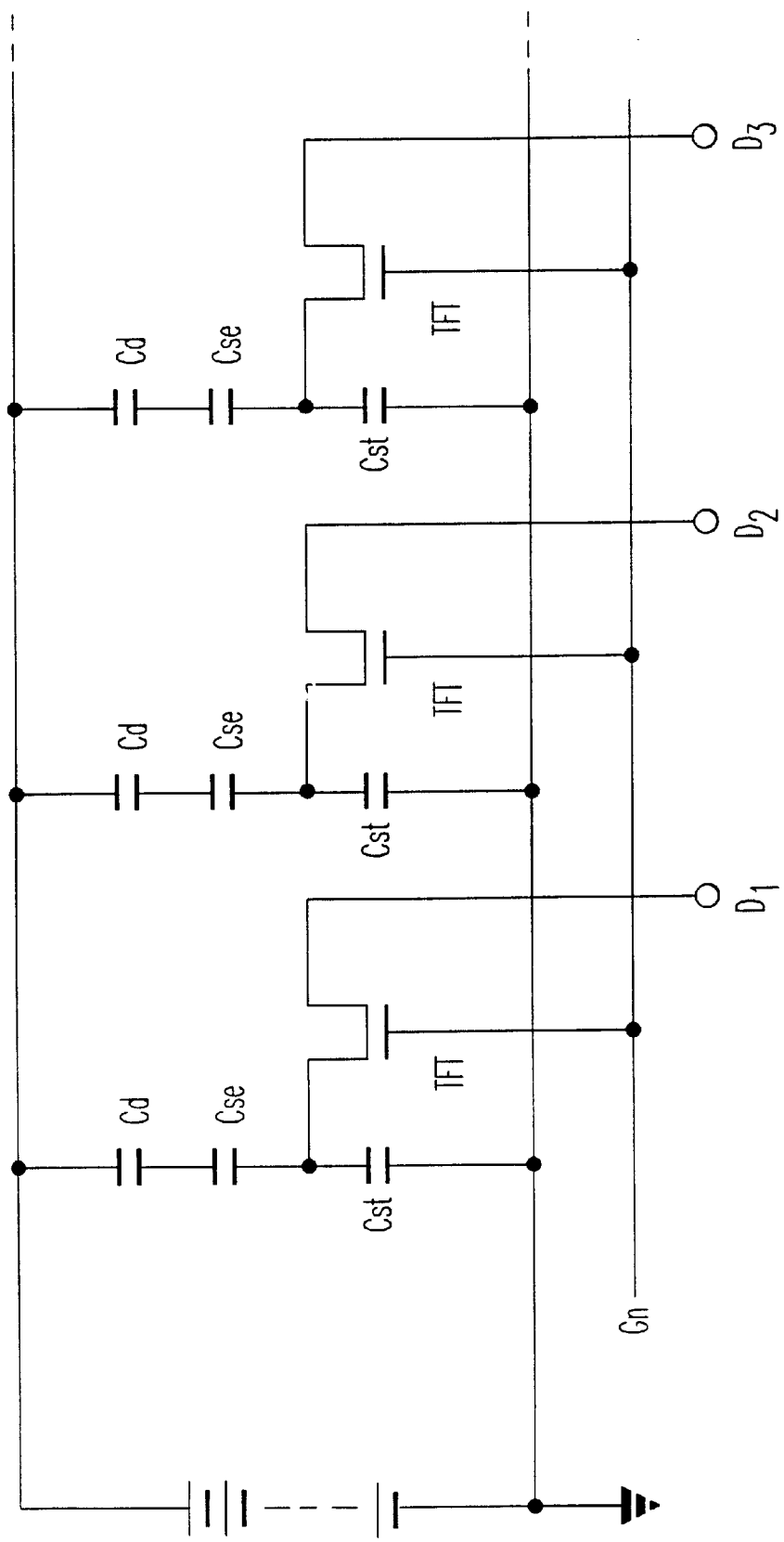
FIG. 14 is a circuit diagram of the conventional X-ray imaging apparatus.

A third embodiment according to the present invention will now be explained. FIG. 9 shows a plan view of the third embodiment of an X-ray imaging apparatus according to the present invention, for example, and in particular one enlarged pixel of the X-ray imaging apparatus formed by 2000×2000 pixels is shown. FIG. 10 is a cross-sectional view taken along a line D–D' in FIG. 9.

The function of the embodiment as shown in FIG. 9 is similar to those of the embodiments as shown in FIG. 2 and FIG. 7. However, in the third embodiment, the capacitor Cst and the MIM share common electrode-insulator-electrode layers, i.e., a capacitor formed by the MIM structure is used as the pixel capacitor Cst 19. Thereby, as compared with the second embodiment as shown in FIG. 7, the opening ratio and the Cst 19 can be increased by removing the bias line 17. Similar to the second embodiment as shown in FIG. 7, an oxide film 33 of the first metallization is used as an insulator of a Cst 19 instead of the SiO$_2$ layer 35. For example, the dielectric ratio of the oxide film of the first metallization made of Ta is seven times higher than that of the SiO$_2$ layer 35 so that a capacitance of a pixel can be increased. Even if a size of the pixel is decreased, the capacity of Cst 19 remains sufficient.

The third embodiment will be explained with reference to the plan view of FIG. 9 and the cross-sectional view as shown in FIG. 10. On the glass substrate 3, a first metallization is segmented into a TFT gate 21, a gate line 13, a leading pad portion 10, a supplemental electrode 15, a lower MIM/Cst electrode 29 and a bias line 17 for the MIM/Cst. An oxide film 33 of the first metallization produced by anodic oxidation is provided on at least the lower MIM/Cst electrode 29 and the supplemental electrode 15. The SiO$_2$ layer 35 is formed thereon. However, the SiO$_2$ layer 35 is not formed at portions corresponding to the leading pad portion 10, a contact point of a voltage supply line 37 (not shown in FIG. 10), the MIM/Cst and the supplemental electrode 15.

As the insulator of Cst 19, the oxide film 33 is used. The pixel electrode 7 (first metallization) for the Cst 19 is formed at a portion in the pixel where the TFT 5 and the MIM 9 are removed. Regarding the TFT 5, an a-Si layer 39, an etch stopper SiNx layer 41 and a n+ a-Si layer 43 are laminated on the SiO$_2$ layer.

On the laminated layers, a source electrode 23 and a drain electrode 25 electrodes are made of a second metallization different than the first. The second metallization also may form a signal line 11, a leading pad portion 27, a voltage supply line 37 (not shown in FIG. 10), and the upper MIM electrode 31.

The first metallization may include Ti, Cr, Ta, Mo, MoW, MoTa, Al, ITO or a laminate structure selected therefrom. The second metallization may include Ti, Cr, Ta, Mo, MoW, MoTa, Al, ITO or a laminate structure selected therefrom.

A third metallization used as the common electrode 49 (not shown) may include Ti, Cr, Ta, Mo, MoW, MoTa, Al, ITO or a laminate structure selected therefrom. As the protective film (not shown), SiNx, SiO$_2$ and polyimide may be utilized. As the X-ray electric charge transfer film 47 (not shown), a-Semiconductor may be utilized.

As the TFT 5, an etching stopper type in a contrary stagger type is used, but a contrary channel cut type in the contrary stagger type or a normal stagger type may be used. As a silicon layer of the TFT 5, although a-Si is used, polysilicon may also be used.

In the direct conversion type X-ray imaging apparatus which is one X-ray imaging apparatus of the X-ray imaging analysis apparatus, the TFD having the MIM structure is used as a protective diode for preventing the TFT 5 from being broken and image quality from being lowered. Thereby, the area of the TFT is relatively small with respect to a pixel and production steps of the TFT array need not change much. Since the pixel capacitor is formed as an insulator with respect to an oxide film of the metal, a high dynamic range Cst, as usually used for photographing, is obtained. Even if pixel size is decreased, a sufficient capacitive value can be prepared.

As described above, in accordance with the present invention, the TFD (especially the MIM type) is used in a reading device for reading electric charge converted from irradiated X-rays and stored in a capacitor.

Therefore, this invention can provide an X-ray imaging apparatus with high sensitivity and high S/N ratio to provide a high opening ratio and prevent currency leakage. This invention can also prevent the TFT 5 and insulator layer from being broken, as well as provide a large capacity capacitance for each pixel. An X-ray detector panel according to this invention can be produced without extensive production step changes.

Also, as regards the first embodiment and second embodiment, a TFD having a MSI structure including a silicon nitride (SiNx) insulating film, instead of the metal oxide insulating film of the MIM structure, or TFDs having a BTB (back-to-back) structure including two series reverse polarity connected diodes can be used instead of a TFD having the MIM structure.

According to the present invention, a thin film diode having a Metal-Insulator-Metal structure can also be provided to protect over-voltage from the pixel capacitor and pixel electrode from damaging the TFT or other devices associated with reading the pixel.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An x-ray imaging apparatus comprising:
   an x-ray—electric charge conversion device configured to generate an electric charge in correspondence with an intensity of an incident x-ray;
   plural pixel electrodes configured to collect the electric charge generated in the X-ray—electric charge conversion device;
   plural charge storage devices corresponding to said plural pixel electrodes and configured to store electric charge collected by respective of said pixel electrodes;
   plural charge reading devices corresponding to said plural charge storage devices and configured to read the charge stored in respective of said charge storage devices; and
   plural thin film diodes, each having a terminal connected to a respective said pixel electrodes and connected in parallel to a respective charge storage device, configured to discharge electric charge stored in the respective charge storage device when an output voltage of the respective charge storage device is greater than a predetermined value, so that the thin film diodes prevent said charge storage devices from destruction by excessive voltage.

2. The X-ray imaging apparatus according to claim 1, wherein said plural thin film diodes have at least one of a Metal-Insulator-Metal (MIM) structure, a metal semi-insulator (MSI) structure, and a back-to-back (BTB) structure.

3. The X-ray imaging apparatus according to claim 1, wherein said plural thin film diodes have a Metal-Insulator-Metal (MIM) structure comprising a metal oxide insulator layer comprising tantalum oxide.

4. An X-ray imaging apparatus comprising:
   an X-ray—electric charge conversion device configured to generate an electric charge in correspondence with an intensity of an incident X-ray;
   plural pixel electrodes configured to collect the electric charge generated in the X-ray—electric charge conversion device;
   plural charge storage devices corresponding to said plural pixel electrodes and configured to store electric charge collected by respective of said pixel electrodes, said plural charge storage devices having a MIM structure configured to discharge electric charge stored therein when an output voltage is greater than a predetermined value;
   plural charge reading devices corresponding to said plurality of charge storage devices and configured to read the charge stored in respective of said charge storage devices.

5. The X-ray imaging apparatus according to claim 4, wherein said plurality of charge storage devices having said Metal-Insulator-Metal (MIM) structure comprise a metal oxide insulator layer comprising tantalum oxide.

6. An X-ray imaging apparatus comprising:
   an X-ray imaging apparatus configured to display an X-ray image of a patient, comprising,
   an X-ray—electric charge conversion device configured to generate an electric charge in correspondence with an intensity of an incident X-ray,
   plural pixel electrodes configured to collect the electric charge generated in the X-ray—electric charge conversion device,
   plural charge storage devices corresponding to said plural pixel electrodes and configured to store electric charge collected by respective of said pixel electrodes,
   plural charge reading devices corresponding to said plurality of charge storage devices and configured to read the charge stored in respective of said charge storage devices; and
   plural thin film diodes, each having a terminal connected to a respective said pixel electrodes and connected in parallel to a respective charge storage device, configured to discharge electric charge stored in the respective charge storage device when an output voltage of the respective charge storage device is greater than a predetermined value, so that the thin film diodes prevent said charge storage devices from destruction by excessive voltage.

7. The X-ray diagnostic apparatus according to claim 6, wherein said plurality of thin film diodes of said X-ray imaging apparatus have at least one of a Metal-Insulator- Metal (MIM) structure, a metal semi-insulator (MSI) structure, and a back-to-back (BTB) structure.

8. The X-ray diagnostic apparatus according to claim 6, wherein said plurality of thin film diodes of said X-ray imaging apparatus have a Metal-Insulator-Metal (MIM) structure comprising a metal oxide insulator layer comprising tantalum oxide.

9. An X-ray diagnostic apparatus comprising:

an X-ray imaging apparatus configured to display an X-ray image of a patient, comprising, an X-ray—electric charge conversion device configured to generate an electric charge in correspondence with an intensity of an incident X-ray, plural pixel electrodes configured to collect the electric charge generated in the X-ray—electric charge conversion device, plural charge storage devices corresponding to said plural pixel electrodes and configured to store electric charge collected by respective of said pixel electrodes, plural thin film diodes having a MIM structure, each having a terminal connected to a respective of said pixel electrodes and connected in parallel to a respective charge storage device and configured to discharge electric charge stored in the respective charge storage device when an output voltage of the respective charge storage device is greater than a predetermined value, so that the thin film diodes prevent said charge storage devices from destruction bv excessive voltage, and plural charge reading devices corresponding to said plural charge storage devices and configured to read the charge stored in respective of said charge storage devices.

10. The X-ray diagnostic apparatus according to claim 9, wherein said plural charge storage devices of said X-ray imaging apparatus have a Metal-Insulator-Metal (MIM) structure comprising a metal oxide insulator layer comprising tantalum oxide.

* * * * *